(12) United States Patent
Naito

(10) Patent No.: US 7,978,016 B2
(45) Date of Patent: Jul. 12, 2011

(54) CRYSTAL OSCILLATOR

(75) Inventor: Kiyoshi Naito, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 43 days.

(21) Appl. No.: 12/461,095

(22) Filed: Jul. 31, 2009

(65) Prior Publication Data

US 2010/0045393 A1 Feb. 25, 2010

(30) Foreign Application Priority Data

Aug. 19, 2008 (JP) .............................. P. 2008-210403

(51) Int. Cl.
*H03B 5/32* (2006.01)

(52) U.S. Cl. .............. 331/158; 331/116 R; 331/116 FE; 331/68

(58) Field of Classification Search .................. 331/158, 331/116 R, 116 FE, 68
See application file for complete search history.

(56) References Cited

U.S. PATENT DOCUMENTS 7,242,258 B2 * 7/2007 Hatanaka et al. ............... 331/68

FOREIGN PATENT DOCUMENTS

| JP | 11-355047 | 12/1999 |
|---|---|---|
| JP | 2003-101408 | 4/2003 |
| JP | 2004-096163 | 3/2004 |
| JP | 2005-033295 | 2/2005 |
| JP | 2005-292079 | 10/2005 |
| JP | 2007-097040 | 4/2007 |

* cited by examiner

*Primary Examiner* — Arnold Kinkead
(74) *Attorney, Agent, or Firm* — Jacobson Holman PLLC

(57) ABSTRACT

A crystal oscillator is provided to secure a space for housing the IC and electronic components, even if the vibrator is small in size. In this crystal oscillator, there is not a hindrance to the wire connections between the IC and the electronic components, and the limitation on the vibrator and oscillator design is reduced. Also, the influence of the heat from the IC and the electronic components is made smaller. Thus, desired characteristics can be readily achieved with this crystal oscillator. In this crystal oscillator, the IC and the electronic components are housed in a concave portion formed in the ceramic package. A pedestal formed with a crystal plate made of the same material as the vibrator is provided to cover almost the entire opening of the concave portion, and the vibrator is placed on the pedestal.

8 Claims, 4 Drawing Sheets

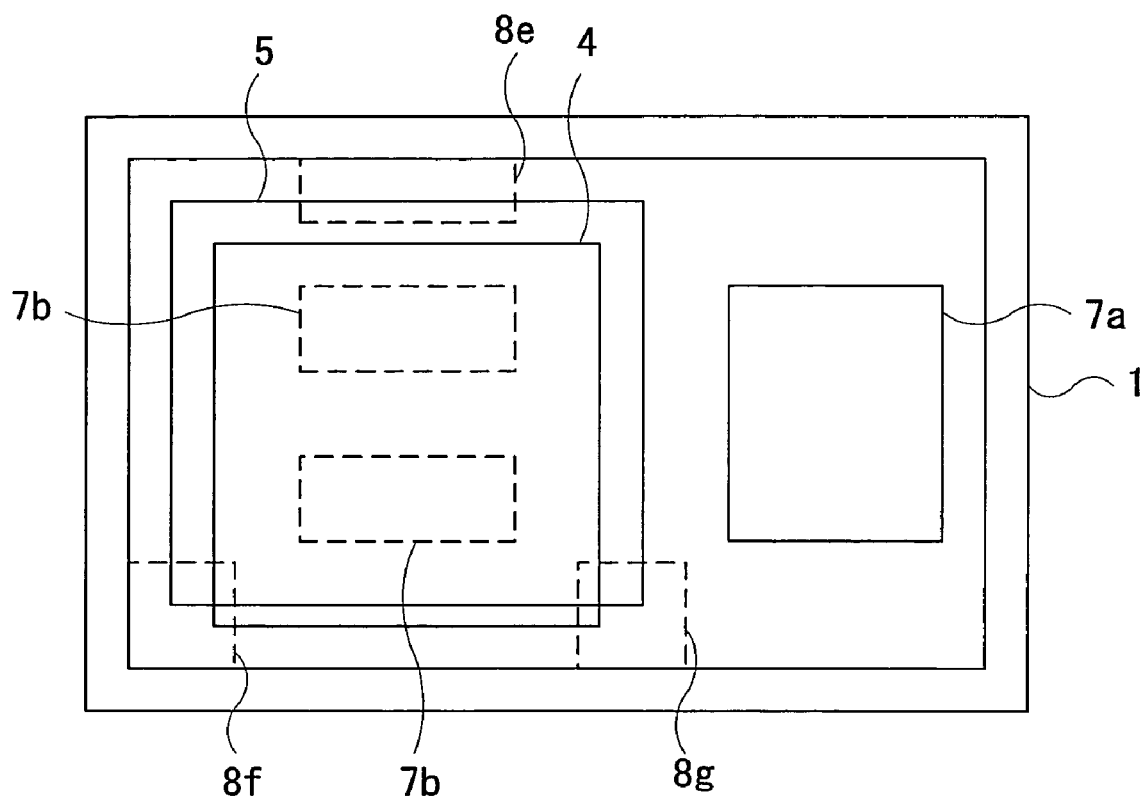

CRYSTAL OSCILLATOR

BACKGROUND OF THE INVENTION

1. Field of the Invention

The present invention relates to a crystal oscillator, and more particularly, to a crystal oscillator that can increase the degree of freedom in design of vibrators and oscillators and readily achieve desired characteristics.

2. Description of the Related Art

Referring to FIG. 3, the structure of a conventional crystal oscillator is described. FIG. 3 is a schematic cross-sectional view showing the structure of a conventional crystal oscillator.

As shown in FIG. 3, an IC 7a and electronic components 7b are housed in a concave portion formed in a ceramic package 1, and a vibrator 4 is placed over the IC 7a and the electronic components 7b.

In the crystal oscillator having the structure, the vibrator 4 is fixed to step-like supporting portions in the ceramic package 1 with a conductive adhesive agent 6. Further, a sealing ring 3 for tightly sealing the case is provided at the upper portion of the ceramic package 1, and a cover 2 is placed on the sealing ring 3, so that the package is tightly sealed.

As described above, in the conventional crystal oscillator, the IC 7a and the electronic components 7b are placed under the vibrator 4. Therefore, the vibrator 4 needs to be large enough to secure a space for housing the IC 7a and the electronic component 7b. Here, the degree of freedom in designing the vibrator 4 is low, and there is a high possibility that the desired characteristics cannot be achieved.

Also, since the IC 7a and the electronic components 7b are housed under the vibrator 4, the vibrator 4 is likely to be affected by the heat released from the IC 7a and the electronic component 7b, and the oscillation frequency might become unstable.

Referring now to FIG. 4, another conventional crystal oscillator is described. FIG. 4 is a schematic top view of another conventional crystal oscillator.

As shown in FIG. 4, in this crystal oscillator, an IC 7a and electronic components 7b are housed in a concave portion in a ceramic package 1. A pedestal 5 made of crystal is provided to cover almost half the opening of the concave portion, and a vibrator 4 is placed on the pedestal 5.

The pedestal 5 is formed with a crystal plate made of the same material as the vibrator 4. The pedestal 5 has no involvement in oscillations, and is one size larger than the vibrator 4. The pedestal 5 is placed on supporting portions 8e, 8f, and 8g formed in the ceramic package 1, and is fixed onto the supporting portions 8e, 8f, and 8g with a conductive adhesive agent.

The supporting portions 8e, 8f, and 8g have step-like shapes in the ceramic package 1.

Although not shown, the vibrator 4 is connected to a wiring unit formed on the side of the bottom face via an electrode. The IC 7a is connected to the electronic components 7b by wire bonding.

With this arrangement, even if the vibrator 4 is small in size, it is possible to secure a space large enough to house the IC 7a and the electronic components 7b. Also, as the pedestal 5 absorbs the heat released from the electronic components 7b, the temperature variation of the vibrator 4 can be made smaller, and excellent frequency characteristics can be achieved.

Conventional techniques relating to crystal oscillator structures are disclosed in Japanese Patent Application Laid-Open (JP-A) Nos. 2007-97040, 11-355047, 2005-033292, and 2005-292079, for example.

JP-A No. 2007-97040 discloses a piezoelectric vibrator in which two or more piezoelectric vibrator plates are housed in a housing, and excitation electrodes are formed on the respective plates and are arranged in a non-overlapping manner in the housing.

JP-A No. 11-355047 discloses a piezoelectric oscillator that has a crystal vibrator placed on a first step-like portion formed in a package, and has a single-layer or multi-layer ceramic cover placed on a second step-like portion.

JP-A No. 2005-033292 discloses an electronic component package that has a concave portion having an upward opening and a concave portion having a downward opening, and allows crystal vibrators to be placed in the respective concave portions. This patent publication also discloses a piezoelectric device that uses the electronic component package.

JP-A No. 2005-292079 discloses a piezoelectric device in which a crystal vibrating piece is held by lead wires, the lead wires form a space between the crystal vibrating piece and a supporting substrate, and a circuit element for driving the vibrating piece is provided in the space.

In the other conventional crystal oscillator, however, the supporting portions 8 having the pedestal 5 mounted thereon in the package protrude from the inner walls of the package. Particularly, the supporting portions 8e and 8g cause a problem by hindering wire bonding connections between the IC 7a and the electronic components 7b. As the crystal oscillator is made smaller in size, this problem with the supporting portions at the time of wiring becomes more serious.

SUMMARY OF THE INVENTION

The present invention has been made in view of those circumstances, and the object thereof is to provide a crystal oscillator that reduces the limitation on the vibrator design so as to reduce the influence of the heat released from the IC and electronic components, and can readily achieve desired characteristics with the supporting portions not hindering the wire bonding connections.

To achieve the object, a crystal oscillator of the present invention includes: a ceramic package that has electronic components and an IC housed in a concave portion; a pedestal that is placed over the electronic portions and the IC, and covers almost the entire opening of the concave portion; a supporting unit that holds the pedestal over the concave portion; and a vibrator that is placed on the pedestal. In this crystal oscillator, the pedestal is formed with a crystal plate made of the same material as the vibrator, and the supporting unit in the concave portion is placed at locations at which the connecting wires for the electronic components and the IC are not placed.

In the crystal oscillator, the supporting unit may be placed at corners of the concave portion.

In the crystal oscillator, the supporting portion may be placed on the short sides of the concave portion.

In the crystal oscillator, the supporting unit may be placed at corners and on the short sides of the concave portion.

In the crystal oscillator, the pedestal has a greater thickness than the vibrator.

In accordance with the present invention, a crystal oscillator includes: a ceramic package that has electronic components and an IC housed in a concave portion; a pedestal that is placed over the electronic portions and the IC, and covers almost the entire opening of the concave portion; a supporting unit that holds the pedestal over the concave portion; and a vibrator that is placed on the pedestal. In this crystal oscillator, the pedestal is formed with a crystal plate made of the same material as the vibrator, and the supporting unit in the concave portion is placed at locations at which the connecting wires connecting the electronic components and the IC are not placed. In this structure, even if the vibrator is small in size, a space large enough to house the electronic components and the IC can be secured, and the supporting unit does not hinder the wire connections between the electronic components and the IC. Thus, a higher degree of freedom can be allowed in the vibrator and oscillator design.

In accordance with the present invention, the thickness of the pedestal is greater than the thickness of the vibrator. Accordingly, the pedestal absorbs the heat released from the IC and the electronic components, and prevents a rapid temperature change in the vibrator. Thus, stable oscillation characteristics can be achieved.

BRIEF DESCRIPTION OF THE DRAWINGS

FIG. 4 is a schematic top view of another conventional crystal oscillator.

Figure 1:
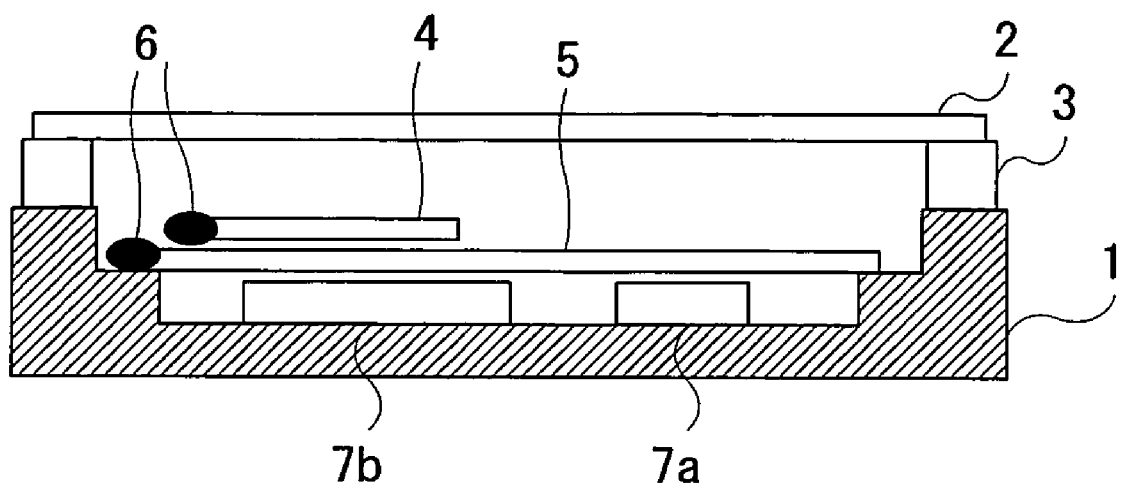
FIG. 1 is a schematic cross-sectional view showing the structure of a crystal oscillator in accordance with an embodiment of the present invention.

DESCRIPTION OF REFERENCE NUMERALS 1 ceramic package
2 cover
3 sealing ring
4 vibrator
5 pedestal
6 conductive adhesive agent
7a IC
7b electronic component
8 supporting portion

DESCRIPTION OF THE PREFERRED EMBODIMENT

General Description of the Invention

The following is a description of an embodiment of the present invention, with reference to the accompanying drawings.

In a crystal oscillator in accordance with this embodiment of the present invention, an IC and electronic components are housed in a concave portion formed in a ceramic package. A pedestal formed with a crystal plate is provided to cover almost the entire opening of the concave portion, and a vibrator is placed on the pedestal. In this crystal oscillator, the pedestal is formed with the crystal plate made of the same material as the vibrator, and the supporting portions for holding the pedestal are provided at locations at which the connection wires connecting the IC to the electronic components are not placed. For example, the supporting portions are provided around the corners or on the short sides of the concave portion in the ceramic package. Accordingly, even if the vibrator is small in size, a space large enough to house the IC and the electronic components can be secured, and the supporting portions do not hinder the wire bonding. Thus, a higher degree of freedom can be allowed in the vibrator and oscillator design.

In the crystal oscillator in accordance with the embodiment of the present invention, the thickness of the pedestal is greater than the thickness of the vibrator. Accordingly, the pedestal efficiently absorbs the heat released from the IC and the electronic components, and prevents a variation in vibrator characteristics due to a temperature change. Thus, stable characteristics can be achieved.

Structure of the Embodiment: FIG. 1

Referring now to FIG. 1, the crystal oscillator in accordance with this embodiment of the present invention is described. FIG. 1 is a schematic cross-sectional view showing the structure of the crystal oscillator in accordance with this embodiment of the present invention.

As shown in FIG. 1, in this oscillator, an IC 7a and electronic components 7b are housed in a concave portion formed in a ceramic package 1. A pedestal 5 is placed over the IC 7a and the electronic components 7b, and a vibrator 4 is further placed on the pedestal 5.

The pedestal 5 is fixed onto step-like supporting portions 8 formed in the ceramic package 1 with a conductive adhesive agent 6. The vibrator 4 is fixed onto the pedestal 5 with the conductive adhesive agent 6, and is electrically connected to the package 1 via the pedestal 5.

A sealing ring 3 for tightly sealing the case is provided at the upper portion of the ceramic package 1, and a cover 2 is placed on the sealing ring 3, so that the package is tightly sealed.

For simplification of the drawing, electrodes and wires are not shown in FIG. 1 either.

By providing the pedestal 5, the size of the vibrator 4 can be arbitrarily set within the inside dimension of the concave portion of the package. By reducing the limitation on the vibrator design, desired characteristics can be readily achieved.

Here, the pedestal 5 is formed with a crystal plate made of the same material as the vibrator 4. The pedestal 5 is thicker than the vibrator 4, and is designed to cover almost the entire opening of the concave portion. The pedestal 5 has no involvement in oscillations.

As the pedestal 5 is formed with a crystal plate made of the same material as the vibrator 4, the pedestal 5 and the vibrator 4 have the same coefficient of thermal expansion. Accordingly, deformation due to a temperature variation can be prevented. Also, as the pedestal 5 is thicker than the vibrator 4, the pedestal 5 absorbs the heat released from the IC 7a and the electronic components 7b housed under the pedestal 5. Accordingly, the heat is hardly transmitted to the vibrator 4, and the oscillations of the vibrator 4 become stable.

Figure 2:
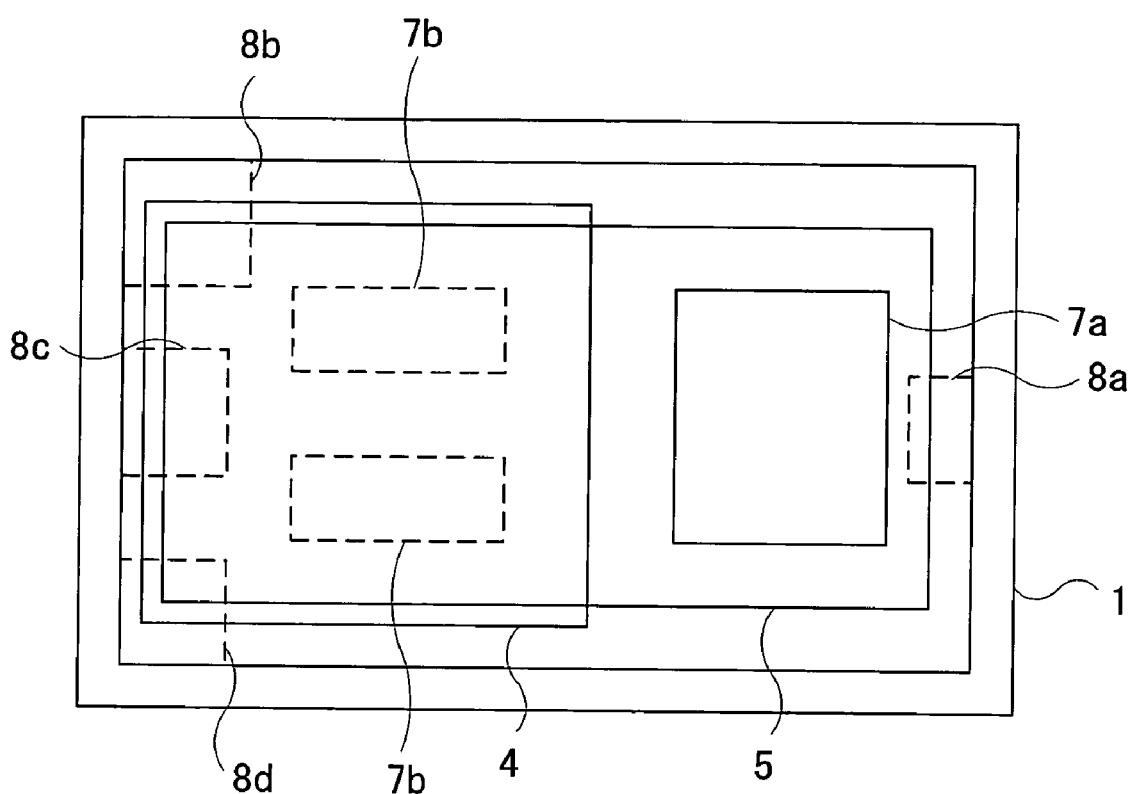
FIG. 2 is a schematic top view of the crystal oscillator.
Figure 3:
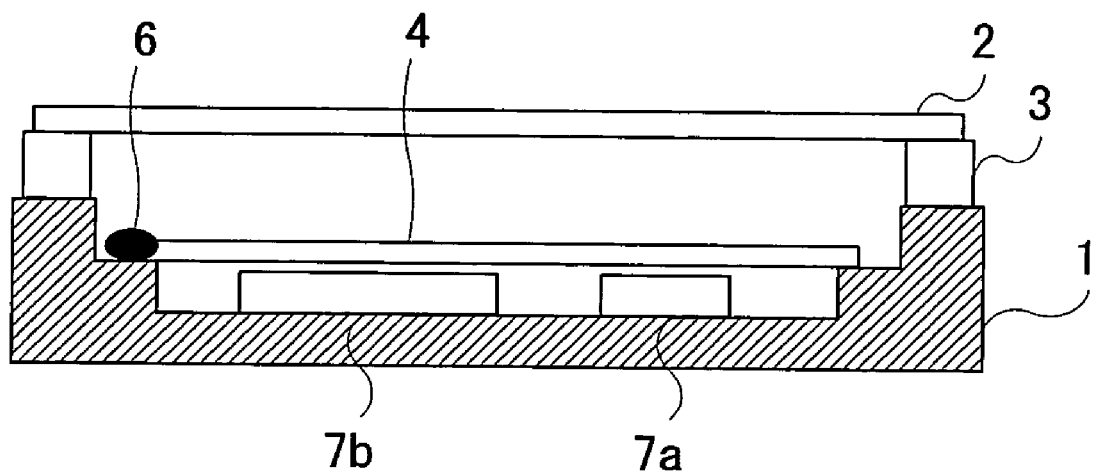
FIG. 3 is a schematic cross-sectional view showing the structure of a conventional crystal oscillator.

Arrangement of the Supporting Portions: FIG. 2

Referring now to FIG. 2, the arrangement of supporting portions 8 is described. FIG. 2 is a schematic top view of this oscillator.

As shown in FIG. 2, in this oscillator, the IC 7a and the electronic components 7b are housed in the concave portion of the ceramic package 1. The pedestal 5 is provided to cover almost the entire opening of the concave portion, and the vibrator 4 is further provided on the pedestal 5.

Supporting portions 8a, 8b, 8c, and 8d for holding the pedestal 5 are formed on the inner walls of the concave portion of the ceramic package 1, and the pedestal 5 is fixed onto the supporting portions 8 with a conductive adhesive agent (not shown).

In this oscillator, the supporting portions 8 are characteristically arranged at the four corners and/or on the short sides of the concave portion of the ceramic package 1.

In the example illustrated in FIG. 2, the supporting portions 8b and 8d are placed at two of the four corners of the concave portion, and the supporting portions 8a and 8c are placed on the short sides of the concave portion.

In this oscillator, the pedestal 5 has such a size as to cover almost the entire opening of the concave portion of the ceramic package 1. Accordingly, the supporting portions 8 can firmly hold the pedestal 5, even if they are placed along the inner periphery of the concave portion and are not placed in the vicinity of the center of the concave portion or in the vicinities of the electronic components 7b.

By forming the supporting portions 8 at the corners and/or the short sides of the concave portion, or by forming the supporting portions 8 along the inner periphery of the concave portion, step-like portions are not formed in the vicinity of the center of the concave portion and in the vicinities of the electronic components 7b, and there is not a hindrance to wire formation when the IC 7a is wire-connected to the electronic components 7b by wire bonding. Also, defects such as disconnecting can be prevented, and a smaller crystal oscillator can be obtained.

Although the supporting portions 8 are formed at both of the corners and on the short sides of the concave portion in this example, the supporting portions 8 may be placed at any locations at which the wires connecting the IC 7a to the electronic components 7b are not placed. For example, the supporting portions 8 may be formed only at the four corners or only on the short sides of the concave portion.

Advantages of the Embodiment

In the crystal oscillator in accordance with the embodiment of the present invention, the IC 7a and the electronic components 7b are housed in the concave portion of the ceramic package 1. The pedestal 5 formed with a crystal plate made of the same material as the vibrator 4 is provided to cover almost the entire opening of the concave portion, and the vibrator 4 is placed on the pedestal 5. The supporting portions 8 for holding the pedestal 5 are provided around the four corners or on the short sides of the concave portion of the ceramic package 1. In this structure, even if the vibrator 4 is small in size, a space large enough to house the IC 7a and the electronic components 7b can be secured, and the supporting portions 8 can be prevented from hindering the wire connections between the IC 7a and the electronic components 7b. The degree of freedom in designing the vibrator and the crystal oscillator can be increased, and desired characteristics can be readily achieved. Furthermore, it is possible to obtain a smaller crystal oscillator.

Since the thickness of the pedestal 5 is greater than the thickness of the vibrator 4, the pedestal 5 absorbs the heat released from the IC 7a and the electronic components 7b, and reduces the influence of the temperature variation on the vibrator 4. Thus, stable characteristics can be achieved.

The present invention can be suitably applied to a crystal oscillator that has a higher degree of freedom in the vibrator and oscillator design, and readily achieves desired characteristics.

What is claimed is:

1. A crystal oscillator comprising:
    a ceramic package that has an electronic component and an IC that are connected to each other and are housed in a concave portion;
    a pedestal that is placed over the electronic portion and the IC, and covers almost the entire opening of the concave portion;
    multiple supporting portions that hold the pedestal over the concave portion; and
    a vibrator that is placed on the pedestal and is set within an inside dimension of the concave portion,
    wherein:
    the pedestal is formed of a crystal plate made of the same material as the vibrator; and
    the supporting portions are placed at locations in the concave portion and are formed along an inner periphery of the concave portion, a connecting wire for the electronic component and the IC being not placed at the locations.

2. The crystal oscillator according to claim 1, wherein one of the supporting portions is placed at corners of the concave portion.

3. The crystal oscillator according to claim 1, wherein one of the supporting portions is placed on short sides of the concave portion.

4. The crystal oscillator according to claim 1, wherein the supporting portions are placed at corners and on short sides of the concave portion.

5. The crystal oscillator according to claim 1, wherein the pedestal has a greater thickness than the vibrator.

6. The crystal oscillator according to claim 2, wherein the pedestal has a greater thickness than the vibrator.

7. The crystal oscillator according to claim 3, wherein the pedestal has a greater thickness than the vibrator.

8. The crystal oscillator according to claim 4, wherein the pedestal has a greater thickness than the vibrator.

* * * * *